US007388288B2

(12) United States Patent
Solzbacher et al.

(10) Patent No.: US 7,388,288 B2
(45) Date of Patent: Jun. 17, 2008

(54) FLIP CHIP METALLIZATION METHOD AND DEVICES

(75) Inventors: Florian Solzbacher, Salt Lake City, UT (US); Reid Harrison, Salt Lake City, UT (US); Richard A. Normann, Park City, UT (US); Hans-Hermann Oppermann, Berlin (DE); Lothar Dietrich, Werder (Havel) (DE); Matthias Klein, Berlin (DE); Michael Töpper, Berlin (DE)

(73) Assignees: University of Utah Research Foundation, Salt Lake City, UT (US); Fraunhofer-Gesellschaft zur Foerderung der angewan, Munich (DE)

( * ) Notice: Subject to any disclaimer, the term of this patent is extended or adjusted under 35 U.S.C. 154(b) by 0 days.

(21) Appl. No.: 11/607,273

(22) Filed: Dec. 1, 2006

(65) Prior Publication Data

US 2008/0096379 A1 Apr. 24, 2008

Related U.S. Application Data

(63) Continuation-in-part of application No. 11/517,540, filed on Sep. 6, 2006, now abandoned.

(60) Provisional application No. 60/831,557, filed on Jul. 17, 2006.

(51) Int. Cl.
*H01L 23/52* (2006.01)

(52) U.S. Cl. ................ 257/738; 438/612; 257/E21.508

(58) Field of Classification Search ................ 257/736, 257/737, 738, 758, 779; 438/612, 613, 614, 438/618, 622, 625, 644, 648, 650
See application file for complete search history.

(56) References Cited

U.S. PATENT DOCUMENTS

| | | | | |
|---|---|---|---|---|
| 6,037,663 | A * | 3/2000 | Yagura et al. | 257/751 |
| 6,387,793 | B1 * | 5/2002 | Yap et al. | 438/612 |
| 2005/0113887 | A1 | 5/2005 | Bauhahn et al. | |
| 2005/0288740 | A1 | 12/2005 | Hassler, Jr. et al. | |
| 2006/0020305 | A1 | 1/2006 | Desai et al. | |

FOREIGN PATENT DOCUMENTS

WO WO02/060527 8/2002

OTHER PUBLICATIONS

Kim et al. "FEA Simulation of Thin Film Coils to Power Wireless Neural Interfaces": Dept of Electrical and Computer Engineering, U of U, pp. 1-4.

* cited by examiner

*Primary Examiner*—Brook Kebede
*Assistant Examiner*—Phillip S. Green
(74) *Attorney, Agent, or Firm*—Thorpe North & Western LLP

(57) ABSTRACT

Interconnect metallization schemes and devices for flip chip bonding are disclosed and described. Metallization schemes include an adhesion layer, a diffusion barrier layer, a wetable layer, and a wetting stop layer. Various thicknesses and materials for use in the different layers are disclosed and are particularly useful for metallization in implantable electronic devices such as neural electrode arrays.

20 Claims, 3 Drawing Sheets

20 28 30 32 34 24 22 Al 26

FLIP CHIP METALLIZATION METHOD AND DEVICES

RELATED APPLICATIONS

This application is a continuation in part of U.S. patent application Ser. No. 11/517,540, filed Sep. 6, 2006, entitled "Flip Chip Metalization Method and Devices" which in turn claims the benefit of U.S. Provisional Patent Application Ser. No. 60/831,557, filed Jul. 17, 2006, entitled "An Integrated Wireless Neural Interface for Chronic Recording and Stimulation." Each of the above applications are incorporated herein by reference.

GOVERNMENT RIGHTS

This invention was made with government support under Grant # NS042362 awarded by the National Institutes of Health. The government has certain rights to this invention.

BACKGROUND

1. Field of the Invention

The present invention relates generally to techniques and devices using flip chip bonding. More particularly, the present invention relates metallization schemes.

2. Related Art

Implantable electronic devices provide the potential to improve the quality of life for many patients. For example, devices are currently known which can help to regulate cardiac rhythm, provide automatic defibrillation, and the like. Activities are underway to develop new devices which can directly interface prosthetic devices to the human nervous system. Such devices may enable paraplegics to regain at least partial control of their bladder or limbs, provide vision for the blind, or restore vocal cord function. Promising initial results have already been obtained with some experiments of implanting neural interfaces into patients.

Implantable electronic devices present many challenges such as material compatibilities, identification of complex neural pathways and associated functions, device sizes, among others. The in vivo environment presents liquids and materials which can be quite corrosive to non-native materials. Implanted devices may provoke immune system reactions and cause other problems. Certain materials can aggravate undesired responses to the living organism in which they are implanted. In general, biocompatible materials are those which have the ability to perform with an appropriate host response in a specific application. Implantable electronic devices can use biocompatible materials, but this tends to limit the choices of materials available. For example, lead tends to be toxic and therefore is typically enclosed in a metal container.

It is desirable for implantable electronic devices to be small to minimize trauma caused by insertion and presence of the device, especially in chronic applications. Conventionally, implantable devices are often packaged in a metal enclosure. While the metal enclosure provides an effective barrier between the electronics and the in-vivo environment, considerable bulk and size is added by the metal enclosure. Such an enclosure approach is also impractical, however, for neural interface arrays which require multiple electrical signal interfaces between the electronics and the living body into which it is implanted. For example, U.S. Pat. No. 5,215,088 to Normann et al., which is incorporated herein by reference, discloses a three-dimensional electrode device which can be used as a neural or cortical implant. The device of Norman, also known as the "Utah Electrode Array" can be used to provide a neural interface to electrical equipment for sensing and/or stimulation.

However, these and other approaches still suffer from drawbacks such as large telemetry, material incompatibilities, reliability, among others. As such, devices and methods which facilitate improved telemetry and biocompatibility which are suitable for use in practical applications continue to be sought through ongoing research and development efforts.

SUMMARY

To reduce the size of implanted devices, it can be desirable to integrate the electronics with the neural interface and eliminate packaging. The elimination of an enclosure, however, can potentially result in exposure of the electronics to the in-vivo environment. Hence, the use of biologically compatible materials becomes more important. Furthermore, many techniques and processes used for high level electronics integration (e.g., multi-chip modules, flip chip bonding, and the like) do not easily translate into processes using biologically compatible materials and the unique requirements of in-vivo implantable devices.

Briefly, and in general terms, the invention is directed to interconnect metallization for electronic devices. In one embodiment, the invention includes a method for interconnect metallization of an electronic device having electrical contacts exposed through a passivation layer. An adhesion layer is deposited on the electrical contacts, and a diffusion barrier layer is deposited on the adhesion layer. A wetable layer is deposited on the diffusion barrier layer and a wetting stop layer is deposited on a portion of the wetable layer.

There has thus been outlined, rather broadly, the more important features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

FIG. 2(*b*) is a top view of the device of FIG. 2(*a*); and

DETAILED DESCRIPTION OF EXAMPLE EMBODIMENT(S)

In describing embodiments of the present invention, the following terminology will be used.

The singular forms "a," "an," and "the" include plural referents unless the context clearly dictates otherwise. Thus, for example, reference to "a layer" includes reference to one or more of such layers, and reference to "an electrical interconnect" includes reference to one or more of such electrical interconnects pads.

As used herein, the term "about" means that dimensions, sizes, formulations, parameters, shapes and other quantities and characteristics are not and need not be exact, but may be approximated and/or larger or smaller, as desired, reflecting tolerances, conversion factors, rounding off, measurement error and the like and other factors known to those of skill in the art.

As used herein, the term "adjacent" refers to items which are in close proximity to one another and preferably in direct physical contact with one another.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

As an illustration, a numerical range of "50-250 nanometers should be interpreted to include not only the explicitly recited values of about 50 nanometers and 250 nanometers, but also include individual values and sub-ranges within the indicated range. Thus, included in this numerical range are individual values such as 60, 70, and 80 nanometers, and sub-ranges such as from 50-100 nanometers, from 100-200, and from 100-250 micrometers, etc. This same principle applies to ranges reciting only one numerical value and should apply regardless of the breadth of the range or the characteristics being described.

Figure 1:
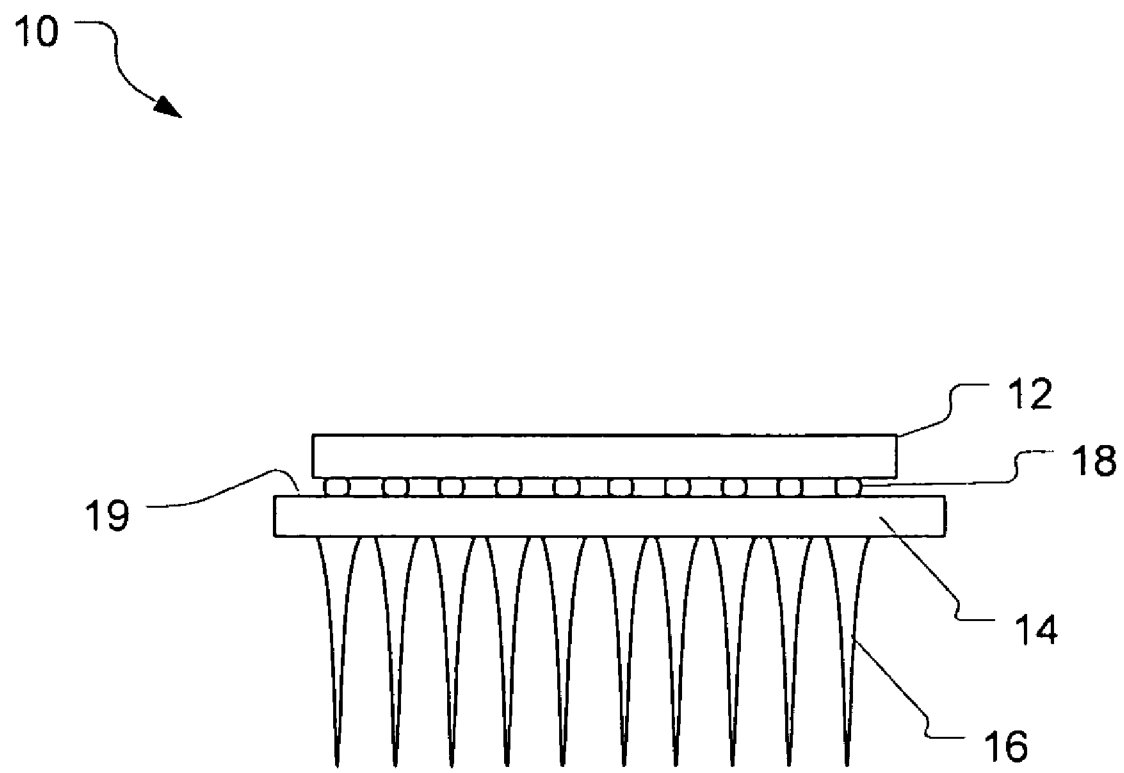
FIG. 1 is a side view of an integrated neural interface array in accordance with an embodiment of the present invention.

FIG. 1 illustrates an integrated neural interface array 10, in accordance with an embodiment of the present invention. The integrated neural interface includes an integrated circuit die 12 flip chip bonded to an electrode array 14. For example, the electrode array can be a Utah Electrode Array having a plurality of extending electrodes 16. The integrated circuit die can be attached to the electrode array via a plurality of solder bumps 18. The integrated circuit die and electrode array may each include a planar array of electrical interconnects (e.g., bond pads) which interconnected via the solder bumps.

Attaching the integrated circuit die 12 to the electrode array 14 presents a number of challenges. Typically, integrated circuits include a final metallization layer of aluminum to define a plurality of bond pads which are exposed through a passivation layer of silicon dioxide or silicon nitride. Aluminum does not, however, wet well to most solder materials.

Challenges are also presented by the nature of the electrode array 14. For example, the Utah Electrode Array presents a similar situation as an integrated circuit, using aluminum pads on the back side 19 for electrical connection to the electrodes 16. The electrode array may also include additional layers of metal, for example for rerouting to define different interconnection layouts. These rerouting layers may also be formed of aluminum, and have pads which are to be connected to the integrated circuit die 12.

As mentioned above, aluminum is not readily soldered to. Furthermore, aluminum is susceptible to corrosion. Hence, a metallization scheme can be used to deposit other types of metals over the bond pads which will bond well to solder while also adhering well to the aluminum. It is also helpful if the metallization can adhere to the passivation layer, for example, to help seal the aluminum from the environment and to increase the area over which the bond stress is distributed. Generally, it is desirable for the metallization to provide an Ohmic contact. Moreover, it is desirable for the metal materials used to be galvanically compatible to help avoid developing electrochemical potentials between the materials. Unfortunately, many materials presently used in electronic chip fabrication are undesirable materials for use in the human body due to risks of toxicity or other adverse affects.

Additional requirements on the underbump metallization include the desire to provide a strong bond between the integrated circuit die 12 and the electrode array 14. The solder bumps 18 may be subjected to forces during implantation process or in-vivo use in excess of those typically encountered in flip chip applications.

An integrated neural interface may also include additional components, such as coils, capacitors, and the like which are electrically connected during a second, later, soldering stage. In such a situation, it is desirable to use a metallization arrangement which is not degraded during subsequent processing steps which may also involve elevated temperatures, for example for additional soldering. In general, the particular choices of metals, thickness of layers, and deposition parameters can all impact the resulting adhesion, internal stress, and reliability of the metallization scheme.

Figure 2A:
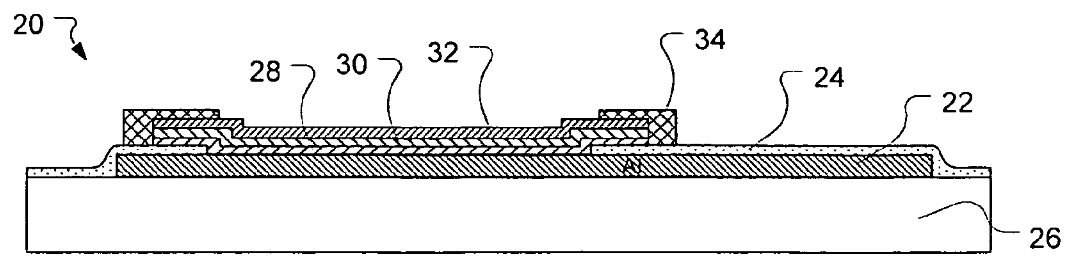
FIG. 2(*a*) is a side cross section view of a device compatible with flip chip bonding showing a detailed metallization scheme in accordance with an embodiment of the present invention.
Figure 2B:
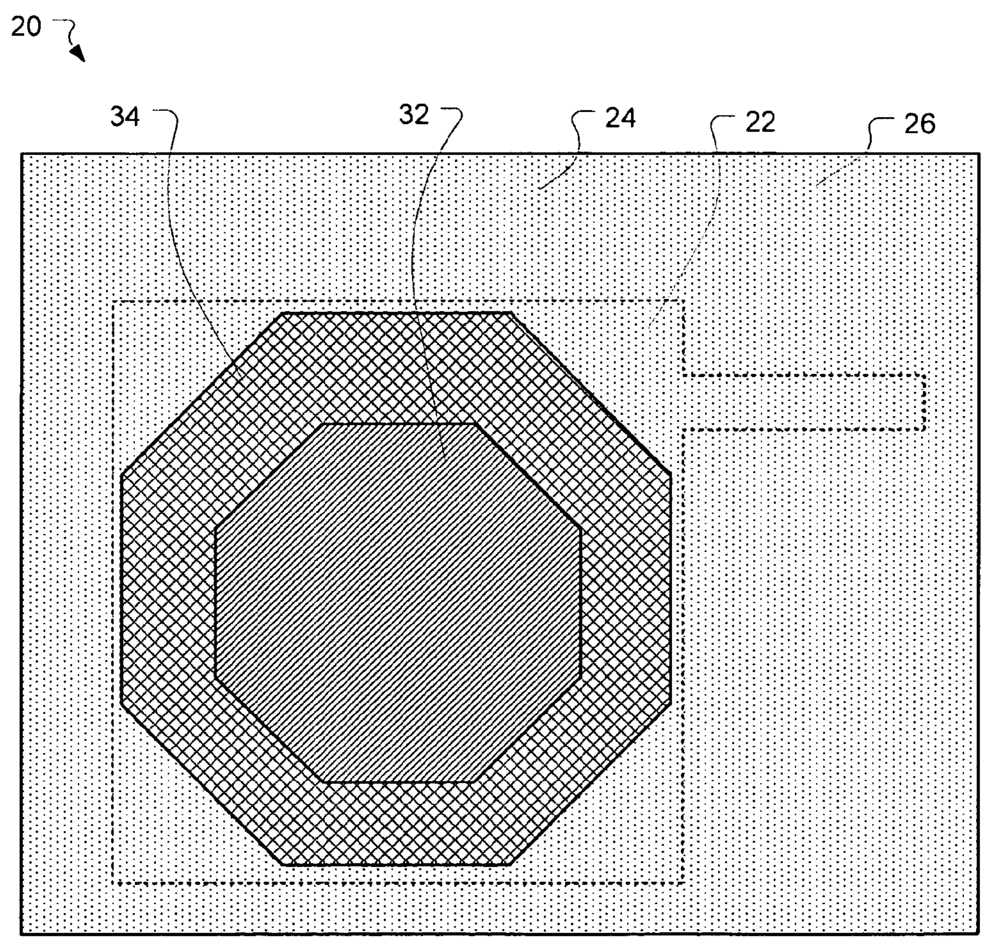

A metallization scheme is illustrated in FIGS. 2(*a*) and 2(*b*) in accordance with an embodiment of the present invention. The underbump metallization, shown generally at 20, is placed on top of an electrical interconnect 22 and passivation layer 24, which form the top surface of an integrated circuit or electrode array 26. The electrical interconnect may include, consist essentially of, or consist of aluminum. The passivation layer may include, consist essentially of, or consist of silicon nitride.

The underbump metallization 20 may include an adhesion layer 28 disposed on the electrical interconnect. The adhesion layer can be a metal that provides good adhesion to the device surface. In particular, the adhesion layer provides good adhesion to the aluminum electrical interconnect. It is also helpful for the adhesion layer to provide good adhesion to the passivation layer 24. Adhesion can be measured, for example, using an adhesive tape test, such as ASTM D 3359.

It has been found that an adhesion layer consisting essentially of titanium performs well in the underbump metallization stack, providing acceptable adhesion to both the aluminum and passivation layers of silicon nitride. The titanium can be about 50 nanometers thick, although thinner or thicker layers may also be used. For example, the thickness of the titanium layers may be within the range of about 20 to about 150 nm. The adhesion layer also helps to hermetically seal the aluminum, reducing the potential for exposure of the aluminum to the in-vivo environment. Combinations of titanium with other materials may also perform well, including for example a combination of titanium and tungsten. In general, the adhesion layer may include, consist of, or consist essentially of titanium.

Adjacent to the adhesion layer 28 is a diffusion barrier 30. The diffusion barrier layer is a metal that provides a barrier to diffusion of other metals within the stack or solder into the underlying electronic device. For example, diffusion of the metal molecules into an integrated circuit can affect the properties of underlying active components. It has been found that a diffusion layer consisting essentially of platinum performs well in the underbump metallization stack 20, providing good adhesion to the underlying adhesion layer as well the following wetable layer 32. The diffusion barrier can be about 150 nanometers thick, although thinner or thicker layers may also be used. For example, the thickness of the diffusion barrier may be within the range of about 50 to about 1000 nm. Combinations of platinum with other materials may also perform well. In general, the diffusion barrier layer may include, consist of, or consist essentially of platinum.

The wetable layer 32 is a metal that is wetable by the solder. A wetable layer is desirable to help provide good reflow of the solder and also a reliable electrical connection. For example, wetting angles between 10 and 50 degrees are achievable and acceptable. It has been found that a wetable layer consisting essentially of gold performs well in the underbump metallization stack, providing good adhesion to the underlying platinum diffusion barrier and providing good wetting properties. For example, gold is compatible with AuSn20 solder (for example, used for flip chip bonding) and with SnCu0.07 solder (for example, used for a second reflow attachment of discrete components). The wetable layer can be about 150 nanometers thick, although thinner or thicker layers may also be used. For example, the thickness of the wetable layer can be within the range of about 50 to about 1000 nm. Combinations of gold with other materials may also perform well. In general, the wetable layer may include, consist of, or consist essentially of gold.

A wetting stop layer 34 can also be placed adjacent to the wetting layer 32. The wetting stop layer is a material which resists wetting by the solder. The wetting stop layer helps to confine the solder to a desired bump area. The wetting stop layer also helps to avoid the solder flowing down conductive traces that may be present on the surface of the electronic device. It has been found that a wetting stop layer consisting essentially of a mixture of titanium and tungsten performs well in the underbump metallization stack, providing good adhesion to the underlying portions of the wetable layer and passivation layer while resisting wetting by the solder. Another advantage of using a mixture of titanium and tungsten is that is can be easily etched without damaging the other layers. For example, a mixture of about 50-50 by atomic weight has been found advantageous. The wetting stop layer can be about 100 nanometers thick, although thinner or thicker layers may also be used. For example, the wetting stop layer can have a thickness within the range of about 20 to about 500 nm. Combinations of titanium, tungsten, and other materials may also perform well. In general, the wetable layer may include, consist of, or consist essentially of titanium and tungsten.

The wetting stop layer 34 defines an open portion of the wetable 32 layer. The open portion can define a round, square, hexagonal, or octagonal shape. An octagonal shape is advantageous in that it helps to retain a generally round shape to the solder balls. Generally, it is desirable to provide overlap between the geometries defined by the various layers to allow for mask misalignment during processing. For example, overlaps of about 5 to 10 microns have proven helpful, although other overlaps may be used.

Features on the adhesion layer 28, diffusion barrier 30, and wetable layer 32 can be defined to extend past the outer edges of electrical interconnect 22 to overlap the passivation layer 24. This can help to provide a larger area for adhesion of the solder ball 18 (FIG. 1), increasing the reliability of the electrical connection.

One benefit of the underbump metallization 20 is to provide a relatively low resistance Ohmic contact. For example, an underbump metallization stack using Ti/Pt/Au/TiW with thicknesses of about 50 nm/150 nm/150 nm/100 nm provided a bond pad to bond pad resistance of about 32 Ohm. Low resistance is desirable for use with a neural interface array, since neural signals tend to be quite small and resistance reduces the amount of neural signal received by the electronics.

Another benefit is that the underbump metallization has been to achieve acceptable stress levels of 58 MPa. The resulting stress in the metallization stack is a function of the metals chosen and the conditions under which the metal layers are deposited. Acceptable stress levels of 58 MPa in the metallization stack were obtained by performing sputtering in an argon atmosphere. Other deposition conditions may also provide acceptable stress levels.

Returning to FIG. 1, the solder bumps 18 can be a gold-tin solder. For example, a solder formed essentially of 80% gold and 20% tin (AuSn20) is advantageous in that it can be applied without a flux. Solder bumps can have a diameter of about 30 to 100 micrometers, although other sizes may be used.

Figure 3:
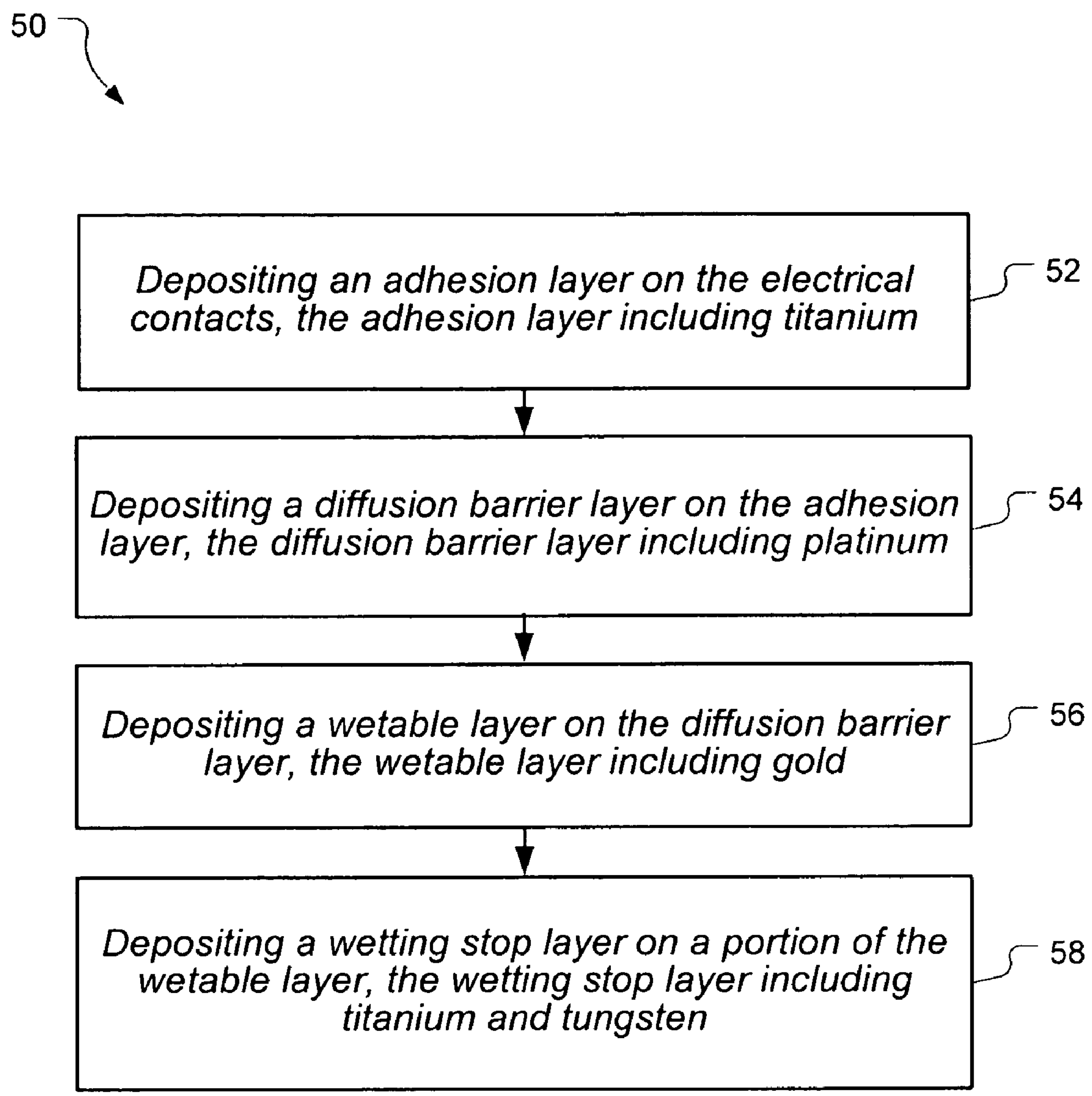
FIG. 3 is a flow chart of a method of interconnect metallization for an electronic device having electrical contacts exposed through a passivation layer in accordance with one embodiment of the present invention.

A method of interconnect metallization will now be described with reference to FIG. 3. The method 50 can include depositing 52 an adhesion layer on the electrical contacts, the adhesion layer including titanium. In preparing the electronic device for deposition of the adhesion layer, aluminum oxide can be removed from the electrical interconnects. This removal can be performed with sputter etching, for example with argon, plasma etching, ion etching, or by a wet chemical treatment.

Deposition of the adhesion (and subsequent) layers can be performed by vacuum deposition, such as evaporation or sputtering, or may be chemically plated, for example, by electroplating or electroless plating. In general, coating and depositing materials can be performed by any process that grows, coats, or otherwise transfers a material onto the device under construction. For example, materials can be coated or deposited by spin coating, dip coating, sputtering, jetting, physical vapor deposition (PVD), chemical vapor deposition (CVD), electrochemical deposition (ECD), molecular beam epitaxy (MBE), atomic layer deposition (ALD), and similar processes.

Features in the adhesion (and subsequent layers) can be formed by lithography. In lithography, the device is coated with a photoresist, the photoresist exposed through a mask, unexposed regions washed away by a developer solution, and etching or other processing used to remove the deposited material from the unexposed regions. Etching can be performed, for example, by wet etching or dry etching such as reactive ion etching (RIE).

The photoresist can be placed over the material to be patterned, and etching performed to remove undesired material. Alternately, the photoresist can be placed under the material to be patterned. After deposition of the material, the photoresist can be dissolved allowing the undesired material to be lifted off. Various lithography techniques are known and used in the semiconductor processing arts and can vary from the above sequence.

A liftoff process is advantageous to avoid the difficulties of etching the noble metals platinum and gold. The lift off process can include a first step of spinning photoresist onto the wafer, followed by exposure and development of the desired pattern to provide windows on the electrical interconnects where the metal is to adhere. Multilayer metal films can be deposited by sputter deposition. After deposition of the metal, the photoresist layer (and overlying metal) is removed, for example, by dissolving the photoresist layer in acetone. Liftoff can also provide for patterning of more than one layer simultaneously.

The method 50 can include depositing 54 a diffusion barrier on the adhesion layer, the diffusion barrier layer including platinum, depositing 56 a wetable layer on the diffusion barrier layer, the wetable layer including gold; and depositing 58 a wetting stop layer on a portion of the wetable layer, the wetting stop layer including titanium and tungsten. These layers can be deposited and features defined as described above.

The method 50 can also include the step of attaching solder bumps to an exposed portion of the wetable layer. Solder bumps can be applied by screening a solder paste onto the wetable layer, attaching preformed solder bumps to the wetable layer, or electroplating solder bumps onto the wetable layer.

An electronic device having solder bumps can be soldered to a second electronic device. For example, underbump metallization can be placed on either an electrode array, an integrated circuit, or both, and the electrode array and integrated circuit solder together by a reflow step to form an integrated neural probe. Applying the same metallization scheme to both the integrated circuit and the electrode array is advantageous in that compatibility of the devices during solder reflow is enhanced by using the same metallization scheme. In applying the metallization to the electrode array, the electrode array may be placed into a handling fixture. For example, the handling fixture may be designed to protect the electrode elements and help to provide even heat distribution across the electrode array during reflow.

Additional components may be soldered to the integrated neural probe. Soldering of subsequent components may use a tin-copper solder, such as one consisting essentially of 93.3 percent tin, 0.7 percent copper (SnCu0.7). Using a different solder than SnAu20 which has a higher melting temperature is advantageous in that the risk of damaging the integrated circuit to electrode array interconnections during the subsequent soldering reflow is reduced. For example, AuSn20 has a melting point of about 278 degrees C., and SnCu0.7 has a melting point of about 227 degrees C.

The underbump metallization scheme described herein appears to be stable during subsequent reflow solder steps, for example, used to attach discrete components to an integrated neural probe. In contrast, metallization schemes having aluminum, nickel, and copper constituents may undergo re-crystallization at temperatures below those of normal solder reflow processing. This in turn may lead to increased stresses and possible failures of the electrical interconnections.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention.

The invention claimed is:

1. A method of interconnect metallization for an electronic device having electrical contacts exposed through a passivation layer, comprising the steps of:

a) depositing an adhesion layer on the electrical contacts, the adhesion layer including titanium;

b) depositing a diffusion barrier layer on the adhesion layer, the diffusion barrier layer including platinum;

c) depositing a wetable layer on the diffusion barrier layer, the wetable layer including gold; and d) depositing a wetting stop layer on a portion of the wetable layer, the wetting stop layer including titanium and tungsten.

2. The method of claim 1, wherein depositing the adhesion layer on the electrical contacts further comprises depositing the adhesion layer on a portion of the passivation layer.

3. The method of claim 1, further comprising the step of using photolithography to define features within at least one of the adhesion layer, diffusion barrier, wetable layer, and wetting stop layer.

4. The method of claim 3, further comprising the step of performing a lift off process to define features within at least one of the adhesion layer, diffusion barrier, wetable layer, and wetting stop layer.

5. The method of claim 1, further comprising the step of attaching solder bumps to an exposed portion of the wetable layer.

6. The method of claim 5, wherein attaching the solder bumps is performed by any of either screening a solder paste onto the wetable layer, attaching preformed solder bumps to the wetable layer, or electroplating solder bumps onto the wetable layer.

7. The method of claim 5, further comprising the step of soldering the electronic device to an integrated circuit to form an integrated neural probe, wherein the electronic device is an electrode array.

8. The method of claim 1, wherein the solder balls consist essentially of a mixture of 80% gold and 20% tin.

9. The method of claim 1, wherein the diffusion layer consists essentially of platinum.

10. The method of claim 1, wherein the wetting stop layer consists essentially of titanium and tungsten.

11. The method of claim 1, wherein the electronic device is an electrode array.

12. The method of claim 1, wherein the electronic device is an integrated circuit die.

13. A product produced by the method of claim 1.

14. A device compatible with flip chip bonding, comprising:

a) an electronic device having a plurality of electrical interconnects disposed in a planar array and exposed through a passivation layer; and b) an underbump metallization stack disposed on at least one exposed electrical interconnect, the underbump metallization stack comprising:

i) an adhesion layer disposed on the electrical interconnect, the adhesion layer including titanium;

ii) a diffusion barrier disposed over the adhesion layer, the diffusion layer include platinum;

iii) a wetable layer disposed over the diffusion layer, the wetable layer including gold; and iv) a wetting stop layer disposed over the wetable layer, the wetting stop layer including titanium and tungsten.

15. The device of claim 14, wherein the passivation layer comprises silicon nitride.

16. The device of claim 14, wherein:

the adhesion layer has a thickness of about 50 nanometers;

the diffusion barrier has a thickness of about 150 nanometers;

the wetable layer has a thickness of about 150 nanometers; and the wetting stop layer has a thickness of about 100 nanometers.

17. The device of claim 14, wherein:

the adhesion layer consists essentially of titanium;

the diffusion layer consists essentially of platinum;

the wetable layer consists essentially of gold; and the wetting stop layer consists essentially of titanium and tungsten.

18. The device of claim 14, wherein the diffusion layer consists essentially of platinum.

19. The device of claim 14 further comprising solder bumps attached to a portion of the wetable layer, the solder bumps consisting essentially of a mixture of 80% gold and 20% tin.

20. The device of claim 14, wherein the adhesion layer, diffusion barrier, and wetable layer define a plurality of octagonal shaped areas for attachment of solder bumps thereto.

* * * * *